United States Patent [19]

Dines et al.

[11] Patent Number: 4,693,408
[45] Date of Patent: Sep. 15, 1987

[54] APPARATUS FOR BONDING CONNECTOR TERMINALS TO CIRCUIT BOARDS

[75] Inventors: David R. Dines, Oklahoma City; Vertis C. Webb, Shawnee, both of Okla.

[73] Assignee: American Telephone and Telegraph, Company AT&T Technologies, Inc., Berkeley Heights, N.J.

[21] Appl. No.: 858,663

[22] Filed: May 2, 1986

Related U.S. Application Data

[62] Division of Ser. No. 701,461, Feb. 14, 1985, Pat. No. 4,653,682.

[51] Int. Cl.⁴ ............................................. B23K 31/02
[52] U.S. Cl. .................................. 228/47; 228/180.2; 29/840; 29/843
[58] Field of Search ...................... 228/8, 9, 49.1, 44.3, 228/47, 43, 180.2; 219/388, 856; 29/840, 843

[56] References Cited

U.S. PATENT DOCUMENTS

| | | | |
|---|---|---|---|
| 2,988,234 | 6/1961 | Barothy et al. | 214/1 |
| 3,000,342 | 9/1961 | Dorosz et al. | 113/129 |
| 3,386,152 | 6/1968 | Plegat | 29/157.3 |
| 3,386,166 | 6/1968 | Tardoskegyi | 29/625 |
| 4,133,423 | 1/1979 | Zankl | 198/339 |
| 4,303,291 | 12/1981 | Dines | 339/17 |
| 4,332,342 | 6/1982 | van Der Put | 228/180 |
| 4,377,024 | 3/1983 | Saperstein | 29/157 |
| 4,429,454 | 2/1984 | Broyer et al. | 29/747 |
| 4,505,035 | 3/1985 | Burton | 228/180.2 |
| 4,536,955 | 8/1985 | Gudgeon | 29/840 |
| 4,583,674 | 4/1986 | Dines et al. | 228/47 |

FOREIGN PATENT DOCUMENTS 584991 12/1977 U.S.S.R. .

OTHER PUBLICATIONS

Brown, Bonded Gold Fingers . . . for General PWB Use, IEEE Transactions, Sep. 78.
H. A. Pohl, "The Assembly of Surface-Mounted Connectors to Bellpac Boards", The Engineer (Western Electric) 1983, Third Issue, pp. 31–35.

Primary Examiner—K. Rowan
Attorney, Agent, or Firm—Kenneth H. Samples; Maurice DePicciotto

[57] ABSTRACT

A connector (10) having two rows of opposed terminals (11, 12) joined by a pair of solder bars (13, 14) is mounted on a printed circuit board (16) with the terminals overlaying circuit board edge contact pads (15, 19) on opposite sides of the board. The assembled connector and circuit board is placed in a fixture whereafter pairs of comb devices are manipulated to position the comb tines between adjoining pairs of terminals. The fixture is conveyed at a fast rate in a first direction past a pair of heaters (34, 35) for preheating the two rows of terminals, the solder bars, and the circuit board pads. Next, the fixture is returned in a second opposite direction at a slow rate past the heaters to melt and thereby solder bond the comb held terminals to their corresponding board pads.

10 Claims, 5 Drawing Figures

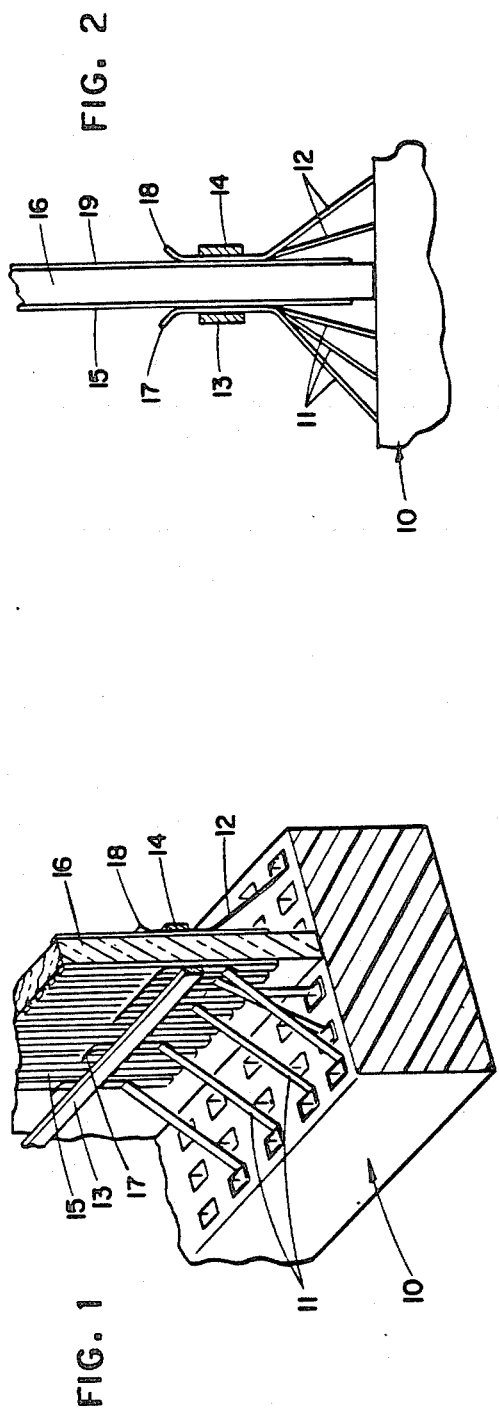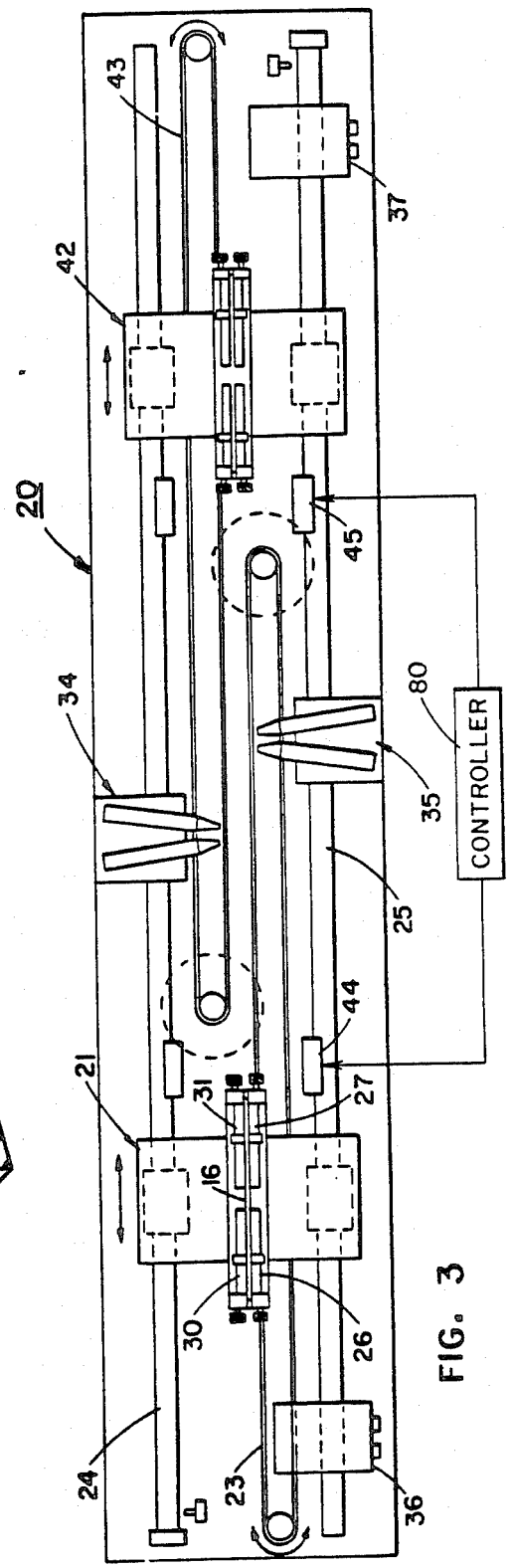

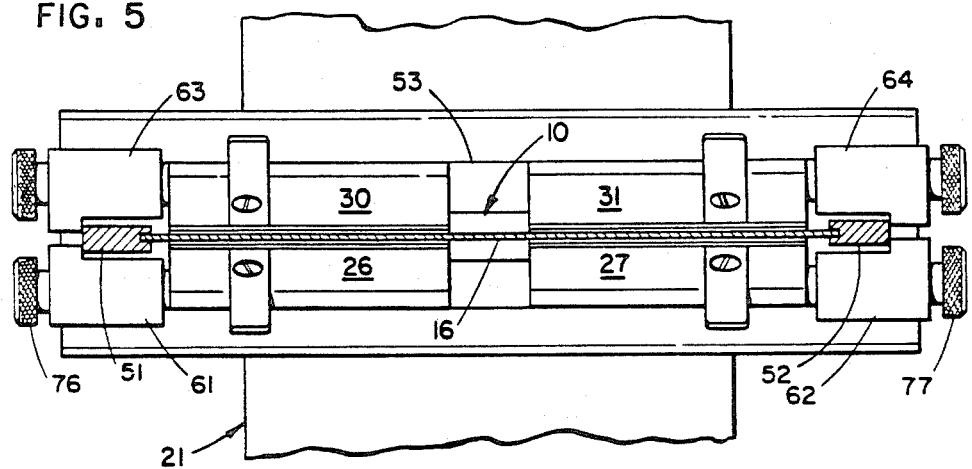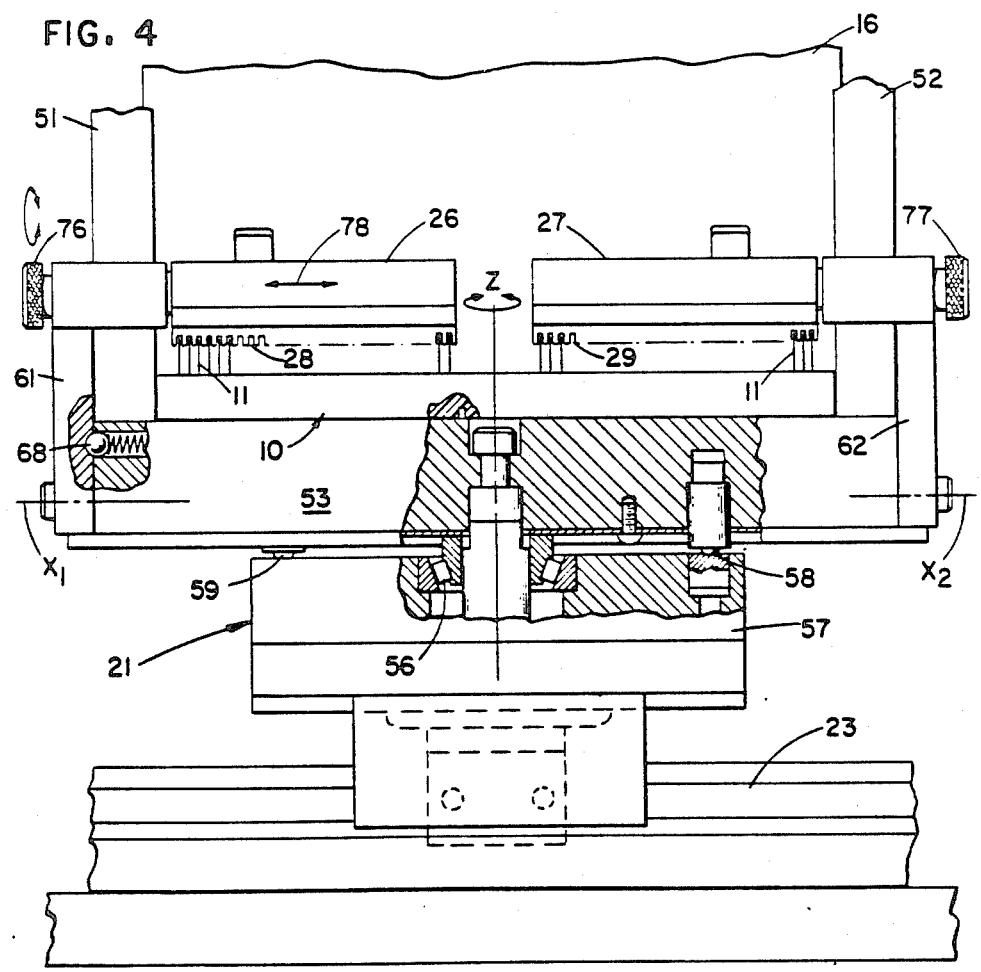

APPARATUS FOR BONDING CONNECTOR TERMINALS TO CIRCUIT BOARDS

This is a division, of application Ser. No. 701,461, filed Feb. 14, 1985 now U.S. Pat. No. 4,653,682.

TECHNICAL FIELD

The present invention relates to a technique for mounting connector blocks onto circuit boards, and more particularly to a method and an apparatus for reflowing solder to bond connector terminals to printed circuit board pads.

BACKGROUND OF THE INVENTION

Printed circuit boards are interconnected to other circuit devices and equipments by forming contact pads along one or more edge sections of the boards and contacting these pads with terminals projecting from a connector housing. In some instances the connector terminals are permanently secured to the pads by coating the pads with solder, engaging the terminals with the pads, and reflowing the solder. In such operations great care must be exercised to insure that each terminal engages only one corresponding contact pad.

The problem is particularly acute in manufacturing large size circuit boards with large numbers of closely spaced small contact pads formed on both the upper and underside of the board that are engaged by two arrays of closely spaced thin spring wire connector terminals. Inasmuch as the contact pads project from the surface of the circuit board, there are formed discrete grooves between each pair of pads. When assembling the connector with the board, there is a tendency for the spring-type terminals to fall from the contact pads and into the grooves, or ride into the grooves during the initial assembly of the connector onto the board.

In some instances, a terminal may be positioned in a groove without engaging either of its adjacent contact pads. In such case, a subsequent reflow soldering operation is ineffective to secure such a terminal to its corresponding contact pad. Also, if a terminal is positioned askew of a pair of contact pads, an ensuing reflow soldering operation would result in the securing of the terminal in bridging relation to two adjacent contact pads. In other instances, a pair of connector terminals may fall within a groove while engaging portions of adjacent contact pads so that the subsequent reflow solder operation functions to establish a conductive bridge between adjacent contact pads. Prior to the reflow soldering of these boards, it is necessary that the terminals positions be visually checked and, as required, the terminals must be manually repositioned to overlie individual contact pads. These operations are very tedious and exacting, requiring a substantial amount of shop time and operator handling.

Therefore, there exists a need for a fast, accurate, as well as, reliable quasi-automated technique for achieving the foregoing reflow soldering of the terminals onto the board while minimizing the need for operator intervention.

SUMMARY OF THE INVENTION

The present invention solves the foregoing problems with an apparatus for reflowing solder to bond a series of spaced terminals projecting from a connector onto contact pads located along the edge of a circuit board where either or both of the terminals and the contact pads have solder deposited thereon, the apparatus comprising a carrier for supporting the circuit board and the connector with its terminals overlaying the contact pads, a heater for projecting a stream of hot air, means for guiding the carrier to move the overlaying terminals and contact pads through the stream of hot air, and means for initially moving the carrier past the stream of hot air at a fast rate to preheat the overlaying terminals, the contact pads and the solder to a temperature below the reflow temperature of the solder and for returning the carrier at a slow rate past the stream of hot air to apply sufficient heat to the solder to reflow and solder bond the terminals to the contact pads.

In accordance with another embodiment of the present invention, a method for bonding a series of spaced terminals projecting from a connector onto contact pads located along the edge of a circuit board wherein either or both of the terminals and the contact pads have solder deposited thereon. The method comprises the steps of supporting in a carrier the circuit board and the connector with the connector terminals overlaying the contact pads, guiding the carrier to move along a predetermined path, projecting a stream of hot air toward a location along the path, moving the carrier from an initial load position at a fast rate past the stream of hot air to preheat the overlaying terminals, the contact pads and the solder to a temperature below the reflow temperature of the solder, and returning the carrier at a slow rate past the stream of hot air to apply sufficient heat to the solder to reflow and solder bond the terminals to the contact pads.

BRIEF DESCRIPTION OF THE DRAWINGS

FIG. 1 is a perspective view of portions of a circuit board and a connector block assembled together;

FIG. 2 is an end view of the board and connector assembly of FIG. 1;

FIG. 3 is a top view of an apparatus in accordance with an embodiment of the present invention;

FIG. 4 is a partial cross-sectional enlarged view of a fixture designed to receive a board and a connector in accordance with an embodiment of the present invention; and FIG. 5 is a top view of a portion of the fixture shown in FIG. 4.

DETAILED DESCRIPTION

Shown in FIGS. 1 and 2, is a connector 10 having two rows of spring-like terminals 11 and 12 projecting from the connector housing in arcuate fashion toward each other. A first solder bar 13 is coined inplace or solder bonded to napes formed in the terminals 11, and a second solder bar 14 is coined inplace or solder bonded to napes formed in the terminals 12. A printed circuit board 16 is inserted between the rows of terminals 11 and 12. The respective rows of terminals are formed with outwardly extending toe sections 17 and 18 to facilitate the insertion of the circuit board 16 into the nips between the rows of terminals. Formed along opposite edge sections of the circuit board 16 are two rows of contact pads 15 and 19 positioned to underlay the bowed sections of the terminals 11 and 12, respectively. As will be described in connection with an embodiment of the invention, the solder bars 13 and 14 are melted and reflowed to solder bond the connector terminals 11 and 12 to their respective contact pads 15 and 19.

Although the connector 10 is shown in FIGS. 1 and 2 as having oppositely positioned rows of spring-like terminals 11 and 12, such a connector may well be of a type having a single row of spring-like terminals all positioned on the same side with respect to the circuit board. In such case, the latter would only have a single row of contact pads on the side facing the connector terminals with its pads positioned to underlay the bowed sections of the terminals.

The solder bars 13 and 14 respectively hold the terminals 11 and 12 in spaced position corresponding to the spacing between the contact pads 15 and 19. However, during the initial securing of the solder bars 13 and 14 to the terminals, some of the terminals may be initially held in position under spring tension, so that when the solder bars are melted and reflowed, the tensioned terminals will shift from the desired positions overlaying the contact pads 15 and 19 resulting in faulty or no connections between the terminals and the contact pads. Also, assembly tolerances may result in a mismatch between all of the terminals and all of the pads. Further, during reflow of the solder bars and heating of the terminals, there may be heat distortion of the terminals so that the terminals do not overlay the contact pads 15 and 19.

Although the solder bars 13 and 14 in FIGS. 1 and 2 are shown respectively attached to the rows of terminals 11 and 12, it may be advantageous instead to deposit solder material directly on the contact pads 15 and 19 of the circuit board 16 thereby eliminating the need for the solder bars 13 and 14. Alternatively, it may be desirable to maintain the solder bars 13 and 14 attached to the rows of terminals, and to provide each contact pad of the circuit board 16 with a small quantity of solder material.

In accordance with an embodiment of the invention, in order to insure that the terminals 11 and 12 overlay their corresponding contact pads 15 and 19 and to prevent the shifting of the terminals during reflow soldering, combing devices are used to hold the terminals in proper alignment with respect to their corresponding contact pads during the melting and subsequent solidification of the solder. In general, each combing device comprises comb tines having widths approximately equal to the spacings between adjacent contact pads so that the connector terminals are held between the tines in overlaying relation to the contact pads. While the solder bars are melted and are subsequently solidified, the connector terminals are held in position by means of the comb tines and are thus accurately solder bonded to their corresponding contact pads.

Referring now to FIG. 3, an assembly including a board 16 and a connector 10 of the type shown in FIGS. 1 and 2, is loaded in a reflow soldering apparatus 20 comprising a fixture 21 designed to receive the board and connector assembly. The fixture 21 is secured to an endless conveyor belt 23 and is adapted to ride along a pair of guide rails 24 and 25. A pair of aligned combing devices 26 and 27, shown with some details in FIG. 4, are manually operated to move sets of comb tines 28 and 29 between the terminals 11. The fixture 21 can be rotated by 180° about a vertical axis Z so that a second pair of aligned combing devices 30 and 31 are manipulated to move sets of comb tines between the terminals 12 on the opposite side of the board 16.

Following each positioning of a combing device 26, 27, 30 and 31, an attending operator would initiate a control mechanism (not shown) to impart a back and forth jogging of the belt 23, under a viewing microscope 36, to aid the setting of the individual comb tines by the operator between the toes 17 and 18 of the two opposite sets of terminals 11 and 12. Once this is accomplished, the fixture 21 carrying the circuit board and connector assembly is moved by the belt 23 at a rapid rate of speed past a pair of heating devices 34 and 35. With the fixture 21 moving at high speed, for example of the order of between 1 and 2 inch/sec, the heating devices 34 and 35 only preheat the solder bars 13 and 14 on the opposite sets of terminals 11 and 12 to a temperature below that needed to melt the solder. The movement of the conveyor belt 23 may be under the control of a programable controller or sequencer of a commercial type available, for example, from the Kiowa Corporation.

After the conveyor belt 23 moves the fixture 21 at a fast rate past the heaters 34 and 35, the controller generates signals that are effective to reverse the direction of movement of the conveyor belt 23 and to slow the speed of the conveyor. The reversal of direction of the conveyor belt 23 moves the assembly back at a slow speed, for example of the order of 0.5 inch/sec, past the heaters 34 and 35 which now apply sufficient heat to melt the preheated solder bars. The molten solder flows onto the contact pads 15 and 19 of the board 16 to solder bond the terminals 11 and 12 to the pads 15 and 19, respectively. Since the solder has an affinity for the terminals and the contact pads, it does not flow onto the adjacent sections of the circuit board 16, or onto the comb structure which is made of nonsolder wettable material such as stainless steel. Following the reflow operation, the combing devices 26, 27, 30 and 31 are opened to allow an operator to inspect, by means for example of microscope 36, the soldered joints between the connector terminals and the board pads.

Referring again to FIG. 3, it will be noted that the reflow soldering machine 20 is provided with a second load station whereat a second operator may load a second assembled printed circuit board and connector into a second fixture 42 and may inspect the second assembly by means of a second viewing microscope 37. The second fixture 42, similar to the first fixture 21, is secured to a second endless belt 43 and rides on the same support rails 24 and 25 utilized to support the first fixture 21. The mode of operation of this portion of the machine 20 is the same as that described with respect to the operation of the portion thereof including the first fixture 21. The controller 80 is programmed with an interlock capability to preclude operation of one fixture (e.g. 21) while the other fixture (e.g. 42) is moving through the heating zone. Sensors 44 and 45 are provided to detect an attempted movement of one fixture into the heating zone while the other fixture is traversing the heating zone. These sensors are selectively enabled, under software control, upon one fixture moving into the heating zone so that the attempted movement of the other fixture into the heating zone is prevented.

Referring now to FIGS. 4 and 5, the construction of the holding fixture 21 and its associated combing devices 26, 27, 30 and 31 will be described in detail. The fixture 21 includes a pair of upright channels 51 and 52 for receiving the side edges of the circuit board 16. The latter rests on a cross member 53 which is rotatably mounted by bearing 56 to a frame section 57 of the fixture 21. The rotatable mounting of the board permits the locating of the comb tines and the inspection of the correct positioning of the terminals and the contact pads on both sides of the board 16 by a single operator. A pair of ball checks 58 and 59 are provided to hold and lock the cross member 53 in position after loading it and while moving it through the heating zone of the heaters 34 and 35.

As shown in FIGS. 4 and 5, pivotally mounted to opposite ends of the cross member 53 are two pairs of comb support arms 61, 62, 63 and 64. A first pair of combs 26 and 27 is pivotally mounted by the arms 61 and 62 about horizontal axes $X_1$ and $X_2$, respectively. Similarly, a second pair of combs 30 and 31, located on the opposite side of the board 16, is pivotally mounted by the arms 63 and 64. Spring loaded balls, one of which is shown and designated by the reference numeral 68, seat within depressions formed in the comb support arms 61 and 62. These spring loaded balls act to resiliently hold the combs 26 and 27 in an open position. Spring loaded balls and depressions are also provided to cooperate with the comb support arms 63 and 64, on the opposite side of the cross member 53, to hold the combs 30 and 31 in an open position.

In order to move and manipulate the combs 26, 27, 30 and 31 to position their respective tines between the terminals, the operator grasps a pair of knurled knobs (such as 76 and 77) and pivots one of the combs, e.g. comb 26, toward the circuit board 16. By turning the knob 76, for example, the operator is permitted to position and shift the tines 28 of comb 26 between the terminal toes of terminals 11 in a direction parallel to the rotation axis $X_1$, as illustratively shown by bidirectional arrow 78. As the tines 28 are moved into position, the spring loaded ball 68 attempt to seat in a second depression (not shown) formed in the arm 61. Due to the designed structural arrangements of the depressions, the ball 68 does not fully seat in the second depression but is spring urged against the walls of the depressions. With the spring urged balls acting to seat within the depressions, the net effect is that the comb tines 28 are resiliently urged into engagement with the circuit board 16 at an angle therewith to allow for air circulation therebetween and flux removal from the combs. After the combs 27, 30 and 31 are manipulated to position their respective tines between the terminals 11 and 12 as just described in connection with comb 26, the fixture 21 is ready to be advanced into the heating zones of heaters 34 and 35 for the preheating and the subsequent reflowing of the solder.

The present invention has been described with reference to particular embodiments thereof. It is to be understood, however, that the described embodiments are merely illustrative of the principles and applications of the invention. Numerous modifications and variations may be made by those skilled in the art without departing from the spirit and scope of the invention.

What is claimed:

1. An apparatus for reflowing solder to bond a series of spaced terminals projecting from a connector onto contact pads located along the edge of a circuit board where either or both of the terminals and the contact pads have solder deposited thereon, which comprises:
    a carrier for supporting the circuit board and the connector with its terminals overlaying the contact pads;
    heating means for projecting a stream of hot air;
    means for guiding said carrier to move the overlaying terminals and contact pads through said stream of hot air;
    means for initially moving the carrier past the stream of hot air at a fast rate in a first direction to preheat the overlaying terminals, the contact pads and the solder to a temperature below the reflow temperature of the solder and for returning the carrier at a slow rate in a second opposite direction past the stream of hot air to apply sufficient heat to the solder to reflow and solder bond the terminals to the contact pads; and
    means for engaging and holding the connector terminals in overlaying position with the contact pads during the moving and returning of the carrier past the stream of hot air.

2. An apparatus in accordance with claim 1 wherein said means for engaging and holding includes means for maintaining the terminals in alignment with their corresponding contact pads during melting and subsequent solidification of the solder.

3. An apparatus in accordance with claim 2 wherein said engaging and holding means comprise a comb having tines interposed between the terminals.

4. An apparatus in accordance with claim 3 further comprising means for mounting said comb on said carrier for rotation about an axis toward and away from the circuit board to position the comb tines between the terminals.

5. An apparatus in accordance with claim 4 wherein said mounting means include means for shifting the comb parallel to the axis of rotation of said mounting means to move the tines relative to the spaces between the terminals.

6. An apparatus in accordance with claim 1 further comprising:
    means for sensing the presence of a circuit board in a carrier being advanced toward said stream of hot air; and
    means responsive to said sensing means failing to sense the presence of a circuit board for reversing said moving means to return the empty carrier to an initial load position.

7. An apparatus in accordance with claim 3 wherein second connector terminals overlay second contact pads located on the opposite side of the circuit board, and wherein second heating means project a second stream of hot air at the overlaying second terminals and second contacts when the carrier moves the circuit board past said second heating means.

8. An apparatus in accordance with claim 7, further comprising a second comb pivotally mounted on said carrier and having tines positionable between said second terminals for holding the second terminals in overlaying position with respect to the second contact pads while said carrier moves said circuit board past said second heating means.

9. An apparatus in accordance with claim 1 wherein said carrier includes:
    a base slideably mounted on said guiding means;
    a fixture for supporting the circuit board and connector; and
    means for rotatably mounting said fixture on said base.

10. A system which comprises two of the apparatuses defined in claim 1 comprising:
    means for mounting the carrier guiding means to advance the respective carrier from oppositely disposed positions; and
    means for preventing the advance of a carrier while the other carrier is moving toward or away from the streams of hot air.

* * * * *